United States Patent [19]

Green et al.

[11] 4,412,903

[45] Nov. 1, 1983

[54] COATING INFRA RED TRANSPARENT SEMICONDUCTOR MATERIAL

[75] Inventors: Geoffrey W. Green, Malvern; Alan H. Lettington, Worcester, both of England

[73] Assignee: National Research Development Corporation, London, England

[21] Appl. No.: 292,433

[22] Filed: Aug. 14, 1981

[30] Foreign Application Priority Data

Aug. 21, 1980 [GB] United Kingdom ................ 8027279

[51] Int. Cl.$^3$ .............................................. C23C 15/00
[52] U.S. Cl. ............................. 204/192 C; 204/192 R; 428/408
[58] Field of Search ..................... 204/192 C; 428/408

[56] References Cited

U.S. PATENT DOCUMENTS

| | | | |
|---|---|---|---|
| 3,840,451 | 10/1974 | Golyanov et al. | 204/192 X |
| 3,854,979 | 12/1974 | Rossi | 428/408 |
| 4,060,660 | 11/1977 | Carlson et al. | 428/408 |
| 4,173,522 | 11/1979 | Pulker et al. | 204/192 X |

OTHER PUBLICATIONS

Holland et al., (A) Thin Solid Films 58 (1979), pp. 107–116.
Holland et al., (B) Thin Solid Films 48 (1978), pp. 121–125.
Marinkovic et al., Carbon, 14 (1976), pp. 329–331.
McKenzie et al., Solar Energy Materials 6 (1981), pp. 97–106.
Sathyamoorthy et al., Thin Solid Films 87 (1982), pp. 33–42.

*Primary Examiner*—Arthur P. Demers
*Attorney, Agent, or Firm*—Cushman, Darby & Cushman

[57] ABSTRACT

A shaped element of germanium or silicon is coated with a layer of hard infra red transparent carbon. The carbon is deposited on the element, used as a cathode, in a glow discharge charge chamber by applying a D.C. voltage to a hydrocarbon gas at a pressure of e.g. $10^{-1}$ to $10^{-2}$ Torr. Prior to depositing the carbon the element may be heated and cleaned using argon ion bombardment. Layers of germanium and silicon may also be deposited using the gases germane and silane respectively.

7 Claims, 1 Drawing Figure

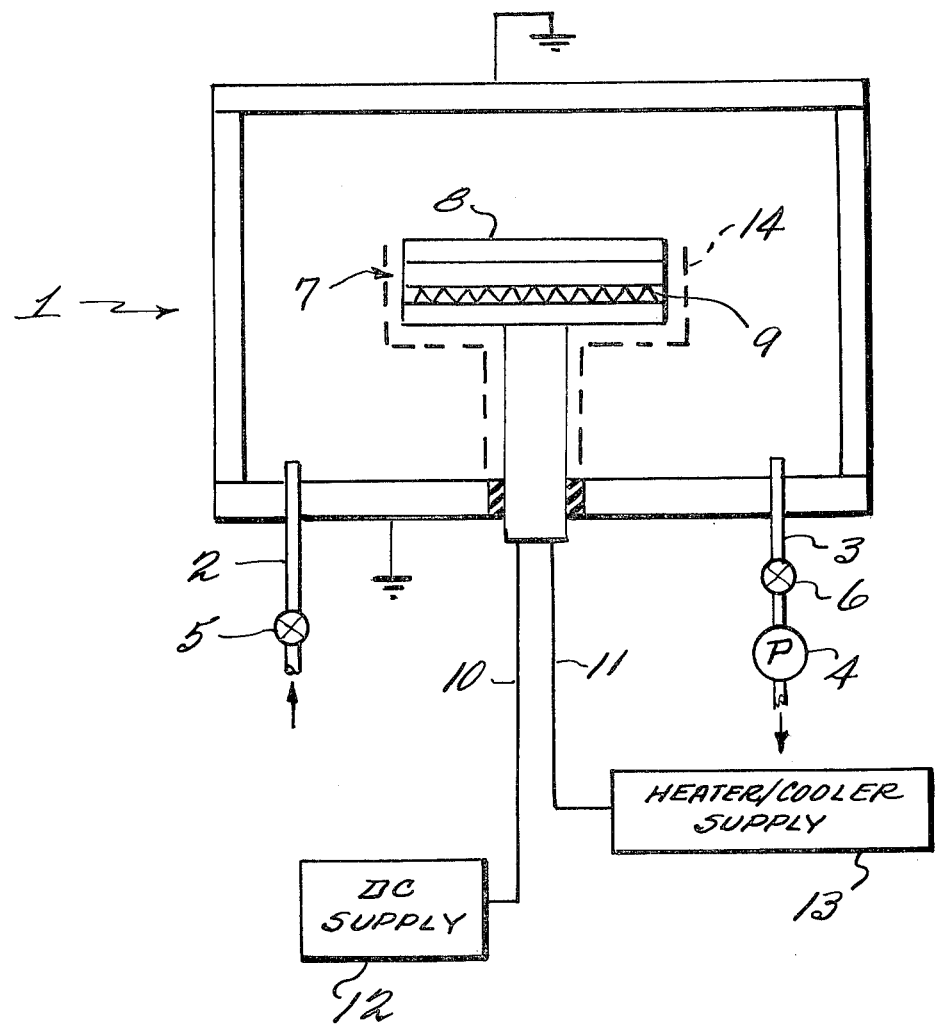

COATING INFRA RED TRANSPARENT SEMICONDUCTOR MATERIAL

This invention relates to the coating of infra red transparent semiconductor materials e.g. germanium and silicon.

The materials germanium and silicon can be produced in infra red (IR) transparent optical quality and are thus useful in lenses and windows for thermal imager systems. Such systems are used for night time viewing e.g. as part of burglar alarms, or for externally detecting high temperature areas in buildings to assist in applying insulation.

One problem with germanium and silicon is their high refractive indices—hence the need for anti-reflection coatings. There are various single and multiple anti-reflection coatings for germanium, some of which are able to provide abrasion and chemically durable layers.

It has been reported, "Thin Solid Films" 58 (1979) 107, L. Holland and S. M. Ojha, that infra red transparent thin hard carbon layers may be deposited on germanium by use of an r.f. glow discharge system. In the same paper reference is also made to D.C. glow discharge being used to deposit a hard carbon film on a metal cathode. It appears to have been believed that growth of hard carbon in a D.C. glow discharge system would not be possible on germanium due to charging of the surface.

It has now been found that hard carbon layers can be deposited onto a germanium cathode using the straightforward D.C. glow discharge without the need to compensate for surface charge.

According to this invention a germanium or silicon element is coated with a thin layer of hard carbon grown in a D.C. glow discharge chamber.

The germanium or silicon element is shaped in the form of a flat or curved plate, or a lens.

The hard carbon layer is deposited in a chamber which is evacuated, then filled with a hydro carbon gas. A D.C. voltage is applied to a holder carrying the germanium or silicon element and a glow discharge is established. This forms a plasma from which carbon ions strike the germanium or silicon and form a hard diamond like layer that is vary hard (diamond-like) and transparent in the 3 to 5 and 8 to 14 $\mu$m wavelength regions of the electro magnetic spectrum.

Prior to depositing the carbon the germanium or silicon may be cleaned by argon ions. This also provides a heating of the semiconductor to assist in good bonding of the carbon. Additionally the germanium or silicon may be heated by a heater in the holder.

The invention will now be described, by way of example only, with reference to the accompanying drawing which shows apparatus for coating germanium.

As shown in the drawing a chamber 1 has a gas inlet port 2, and an outlet port 3 connected to a vacuum pump 4. Valves 5, 6 control flow through these ports 2, 3. Inside the chamber 1 is a holder 7 which carries a piece of germanium 8, a flat plate or lens. The holder 7 may contain a heater 9 and/or cooler and is electrically insulated from the chamber 1. Electrical leads 10, 11 pass from the holder 7 to a D.C. power supply 12 and heater/cooler supply 13 outside the chamber 1.

The germanium plate or lens 8 is an optical quality material transparent in the 3-5 and 8-14 $\mu$m wavelength, its electrical resistivity is around 5-20 ohm cm.

Operation to coat the germanium 8 is as follows. The chamber 1 is evacuated to about $10^{-4}$ Torr. or lower to remove air and contaminants. Argon gas is bled into the chamber 1 whilst the pump 6 is throttled down to give a pressure of about $10^{-1}$ to $10^{-2}$ Torr.

A D.C. voltage of about $-2$ to $-5$ kV is applied to the germanium 8 and holder 7 causing initiation of a glow discharge. Argon ions from the plasma thus created strike the germanium 8 to both clean its surface and raise its temperature. Typically 10 minutes of argon ion bombardment is used.

Whilst maintaining the glow discharge, the argon supply is stopped and a hydrocarbon gas emitted into the chamber 1. This gas may be butane, methane, acetylene, etc. and forms hydro-carbon plasma. A layer of hard diamond like carbon is formed by positively charged carbon ions being attracted to and striking the negatively charged germanium 8 where they gradually build up a layer of the required thickness. Typically a 1 $\mu$m thick layer is formed in about 1 hour.

To provide an anti-reflection layer the optical thickness of the carbon is about one quarter wavelength at the required operating wavelength e.g. 1.2 $\mu$m thickness in the 8-13 $\mu$m wavelength band.

When the layer is fully grown the D.C. supply is stopped, the vacuum inside the chamber is released, and the germanium plate or lens removed.

In a modification the argon ion heating step may be omitted. Heating of germanium to e.g. 250° C. may be by the heater 9 in the holder 7. Above above 300° C. the carbon deposit becomes graphite and absorbing to infra red.

The negative potential applied to the germanium substrate may be increased as a carbon layer builds up, to overcome the insulating effect of the carbon layer which tends to limit the layer thickness.

To prevent deposition of carbon where not wanted e.g. on side and lower surface of the germanium, such areas may be covered with aluminum foil prior to placing the germanium element in the chamber. Additionally electrode screening 14 may be used to prevent deposition on the cathode structure.

Silicon is coated in a manner similar to that for germanium.

Multilayers of anti-reflection coatings may be formed by the apparatus shown in the drawings. For example silicon and germanium layers may be grown in a DC glow discharge using the gas silane and germane.

Thus for example alternate layers of carbon and germanium may be grown on a germanium lens using butane and germane gas supplies. The final layer is preferably carbon because of its abrasion resistance.

What I claim is:

1. A method of coating an infra red transparent germanium or silicon element with a layer of hard carbon comprising the steps of:
   (i) placing the element on a cathode structure in a vacuum chamber,
   (ii) substantially evacuating the chamber,
   (iii) heating the substrate to a temperature not exceeding 300° C.,
   (iv) admitting a hydrocarbon gas into the chamber while maintaining a substantial vacuum,
   (v) applying a D.C. voltage between the cathode and an anode in the chamber, and
   (vi) maintaining the substrate temperature below 300° C., whereby a glow discharge is initiated and maintained in the chamber so that carbon ions strike the element and build up a hard carbon layer substantially transparent to infra red radiation.

2. A method according to claim 1, wherein prior to deposition of the carbon the element is subjected to argon ion bombardment in a glow discharge.

3. A method according to claim 1, further comprising the step of depositing a layer of silicon by glow discharge from a gas silane.

4. A method according to claim 1 further comprising the step of depositing a layer of germanium by glow discharge from a gas germane.

5. A method according to claim 1 wherein said step (ii) comprises the step of evacuating the chamber to at least $10^{-4}$ Torr.

6. A method according to claim 5 further comprising before step (iv) the steps of:

(a) introducing Argon gas into the chamber and bringing the pressure of the chamber to substantially $10^{-1}$ to $10^{-2}$ Torr.

(b) applying a D.C. voltage in the range of $-2$ to $-5$ KV between the cathode structure and the anode to produce a glow discharge, thereby creating an Argon plasma and causing Argon ions to strike the germanium or silicon element thereby cleaning its surface and raising its temperature, and (c) exhausting the Argon gas from the chamber.

7. A method according to claim 1 further comprising the step of:

(vii) as the hard carbon layer builds up during step (vi), increasing the negative potential applied to the cathode structure to overcome an insulating effect caused by the increasing thickness of the hard carbon layer.

* * * * *